US010741747B2

(12) United States Patent
Calestani et al.

(10) Patent No.: US 10,741,747 B2
(45) Date of Patent: Aug. 11, 2020

(54) ZINC OXIDE-BASED PIEZOELECTRIC DEVICE

(71) Applicants: Bercella S.r.l., Parma (IT); CNR Consiglio nazionale Delle Ricerche, Rome (IT)

(72) Inventors: Davide Calestani, Rome (IT); Nicola Coppede, Parma (IT); Maurizio Culiolo, Parma (IT); Davide Delmonte, Parma (IT); Marco Lani, Parma (IT); Andrea Zappetini, Parma (IT); Laura Marchini, Parma (IT); Rocco Bercella, Parma (IT)

(73) Assignees: Bercella S.r.l., Parma (IT); CNR Consiglio Nazionale delle Ricerche, Rome (IT)

( * ) Notice: Subject to any disclaimer, the term of this patent is extended or adjusted under 35 U.S.C. 154(b) by 857 days.

(21) Appl. No.: 15/128,973

(22) PCT Filed: Mar. 12, 2015

(86) PCT No.: PCT/IB2015/051801
§ 371 (c)(1),
(2) Date: Sep. 24, 2016

(87) PCT Pub. No.: WO2015/145290
PCT Pub. Date: Oct. 1, 2015

(65) Prior Publication Data

US 2017/0186938 A1 Jun. 29, 2017

(30) Foreign Application Priority Data

Mar. 24, 2015 (IT) ................................ MI2014A499

(51) Int. Cl.
*H01L 41/37* (2013.01)
*H01L 41/317* (2013.01)
(Continued)

(52) U.S. Cl.
CPC ...... *H01L 41/1132* (2013.01); *H01L 41/0478* (2013.01); *H01L 41/09* (2013.01);
(Continued)

(58) Field of Classification Search
CPC .................................................. H01L 41/1132
See application file for complete search history.

(56) References Cited

U.S. PATENT DOCUMENTS 5,402,793 A * 4/1995 Gruner ................ A61B 1/0052 600/447
7,483,545 B2 * 1/2009 Nagaoka ............... H04R 7/122 381/423

(Continued)

OTHER PUBLICATIONS

Skandani, "Enhanced vibration damping of carbon fibers-Zn)." Applied Physics Letters 101(7):073111/1-4 Aug. 13, 2012.

(Continued)

*Primary Examiner* — Thomas M Dougherty
*Assistant Examiner* — Karen B Addison
(74) *Attorney, Agent, or Firm* — Cittone Demers & Arneri LLP; Henry J. Cittone

(57) ABSTRACT

The present invention relates to a zinc oxide-based piezoelectric device, utilizable both as a sensor and as an actuator. More in particular, the present invention relates to a piezoelectric device (1, 101) comprising at least two carbon fibre crossed yarns (2_a_, 2_b_; 102_a_, 102_b_), at the intersection of which a zinc oxide layer (3, 103) in nanorod form is arranged, wherein an end (4_a_, 4_b_) of each of said yarns (2_a_, 2_b_; 102_a_, 102_b_) is connected to an operative unit (5).

28 Claims, 1 Drawing Sheet

(51) Int. Cl.
*H01L 41/09* (2006.01)
*H01L 41/18* (2006.01)
*H01L 41/314* (2013.01)
*H01L 41/316* (2013.01)
*H01L 41/113* (2006.01)
*H01L 41/047* (2006.01)

(52) U.S. Cl.
CPC ............ *H01L 41/18* (2013.01); *H01L 41/314* (2013.01); *H01L 41/317* (2013.01); *H01L 41/37* (2013.01); *H01L 41/316* (2013.01)

(56) References Cited

U.S. PATENT DOCUMENTS 8,283,739 B2 * 10/2012 Park ....................... B82Y 10/00 257/415
8,481,158 B2 * 7/2013 Nakayama ................ B82B 1/00 428/367
2011/0084345 A1 * 4/2011 Park ....................... B82Y 10/00 257/415
2012/0319218 A1 * 12/2012 Park ....................... B82Y 10/00 257/415

OTHER PUBLICATIONS

Kumar, "Growth of novel Zn0 nanostructures by soft chemical routes." Journal of Alloys and Compounds 506(1):351-355 Sep. 10, 2010.
Li, "Controllable growth of well-aligned Zn0 nanord arrays by low-temperature wet chemical bath deposition method." Applied Surface Science 256(6):1698-1702 Jan. 1, 2010.
Liao, "Carbon fiber-Zn0 nanowire hybrid structures for flexible and adaptable strain sensors." Nanoscale 5(24):12350-12355 Oct. 10, 2013.
Qin, "Microfibre-nanowire hybrid structure for energy scavenging." Nature 451(7180):809-813 Feb. 14, 2008.
Italian Search Report in MI2014A000499 dated Nov. 27, 2014.
International Search Report in PCT/IB2015/051801 dated Nov. 15, 2015.
Written Opinion of the International Searching Authority in PCT/IB2015/051801 dated Nov. 20, 2015.

* cited by examiner

ZINC OXIDE-BASED PIEZOELECTRIC DEVICE

CROSS-REFERENCE TO RELATED APPLICATIONS

This application is the U.S. National Stage of PCT International Patent Application No. PCT/IB2015/051801, filed Mar. 12, 2015, which claims priority to Italian Patent Application No. MI2014A000499, filed Mar. 24, 2014, the disclosures of each of which are incorporated herein by reference in their entirety.

STATEMENT REGARDING FEDERALLY SPONSORED RESEARCH OR DEVELOPMENT

Not Applicable.

THE NAMES OF THE PARTIES TO A JOINT RESEARCH AGREEMENT

Not Applicable.

INCORPORATION-BY-REFERENCE OF MATERIAL SUBMITTED ON A COMPACT DISC OR AS A TEXT FILE VIA THE OFFICE ELECTRONIC FILING SYSTEM (EFS-WEB)

Not Applicable.

STATEMENT REGARDING PRIOR DISCLOSURES BY THE INVENTOR OR A JOINT INVENTOR

Not Applicable.

BACKGROUND OF THE INVENTION

(1) Field of the Invention

The present invention relates to a zinc oxide-based piezoelectric device, utilisable both as a sensor and as an actuator.

(2) Description of Related Art Including Information Disclosed Under 37 CFR 1.97 and 1.98

The use of piezoelectric materials for making sensors or actuation devices is known.

A material is defined as piezoelectric when it can generate a voltage difference if it is subjected to mechanical deformation. In practice, when an external pressure is applied, charges of opposite signs position themselves on the opposite faces of the material; i.e. a net electric dipole moment is created in the unit cell. Crystal behaves as a capacitor to which a voltage difference has been applied. If the two faces are connected by an external circuit, an electric current is then generated called piezoelectric current and this effect is called a "piezogenerator effect". Conversely, when a voltage difference is applied to the material, it expands or contracts ("piezomotor effect"). These effects are reversible and are realised on scales of the order of nanometres.

Various materials able to generate a piezoelectric effect exist. Among these, barium titanate ($BaTio_3$), lead and zirconium titanate ($PbZr_xTi_{1-x}\ O_3$), lithium niobate (LiNbO3), langasite ($La_3Ga_5SiO_{14}$), lithium tetraborate ($Li_2B_4O_7$), gallium orthophosphate ($GaPO_4$), quartz, and zinc oxide (ZnO).

In particular, various ZnO-based devices have been proposed in which nanocrystals of such material are deposited on a polymer or carbon fibre medium, in order to give the device a considerable flexibility and flexural strength. In these devices the ends of a filament of ZnO crystals are connected to appropriate electrodes, typically gold electrodes, which are then appropriately electrically connected to an instrument for measuring the voltage or current generated thereby. These devices, essentially of the experimental type, are however quite complex and, in the same way as traditional sensors, are not easy to integrate into large structures for monitoring structural movements thereof, on account of the difficulties of positioning them in place and the need for cabling.

BRIEF SUMMARY OF THE INVENTION

One purpose of the present invention is therefore a piezoelectric device of simple geometry which can be easily integrated into various structures made from composite materials, including large composite structures.

Another purpose is a piezoelectric device which can be used either as sensor or as an actuator even in large structures.

A further purpose of the invention is a method of making an article in carbon fibre material in which one or more piezoelectric devices according to the invention are integrated.

The present invention thus relates to a zinc oxide-based piezoelectric device as outlined in the appended claims, the definitions of which form an integral part of the present description.

BRIEF DESCRIPTION OF THE SEVERAL VIEWS OF THE DRAWING(S)

Further characteristics and advantages of the present invention will, in any case, be more clearly comprehensible from the description given below of a preferred embodiment, made by way of a non-limiting example with reference to the appended drawings, wherein.

DETAILED DESCRIPTION OF THE INVENTION

Figures 1, 2A, 2B:
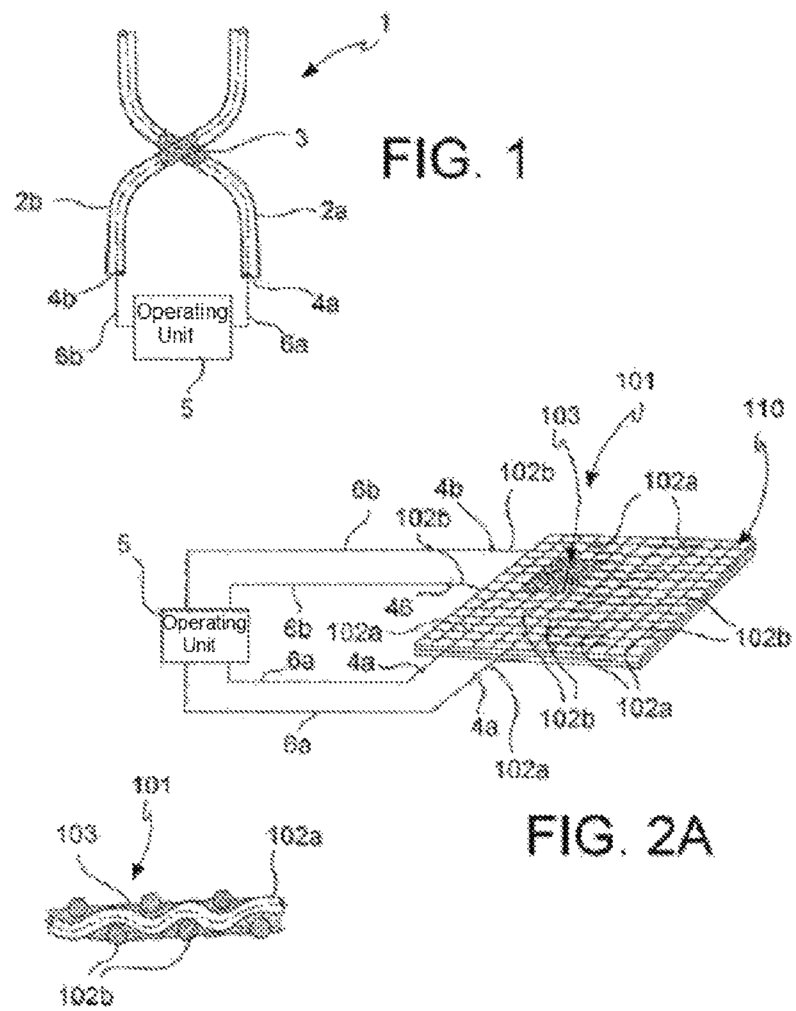
FIG. 1 is a schematic view of a piezoelectric device according to the invention.
FIG. 2A is a schematic perspective view of a different embodiment of the piezoelectric device of the invention.
FIG. 2B is a schematic side view of an enlarged detail of the device in FIG. 2A.

As shown in FIG. 1, the piezoelectric device of the invention, globally denoted by reference numeral 1, comprises at least two carbon fibre crossed yarns 2*a*, 2*b*, at the intersection of the yarns 2*a*, 2*b*, a nanostructured zinc oxide (ZnO) layer 3 being arranged. One end 4*a*, 4*b* of each of said yarns 2*a*, 2*b* is connected to an operating unit 5, possibly by means of appropriate cabling 6*a*, 6*b*. Given the conductive properties of carbon fibre, it is also possible to directly connect the ends of the yarns 2*a*, 2*b* to the operating unit 5.

The expression "at the intersection of the yarns 2*a*, 2*b* a layer of zinc oxide being arranged" means that the layer of ZnO covers a portion of said yarns 2*a*, 2*b* which comprises their intersection, but which may be much more extensive.

Said yarns 2*a*, 2*b* may be of an appropriate length depending on the size of the article to which the device of the invention is applied and depending on the position in which the device is placed. In fact, in the device of the invention the yarn 2*a*, 2*b* in carbon fibre is the signal conductor yarn, thanks to its electrical conductivity. This way it is possible to place the operating unit 5 in any remote location, while one or more devices 1 can be placed freely in the points of the article in which a structural change needs to be monitored (if the device 1 is used as a sensor) or cause a morphological change of the article (if the device 1 is used as an actuator). The device 1 does not require external electrical contacts and only being characterized by a structure of carbon fibre coated with ZnO, can be easily integrated in a carbon fibre article in which it can be embedded.

If the length of the yarns 2*a*, 2*b* is extensive, it may be convenient or necessary to apply a signal amplifier in appropriate positions.

In certain embodiments, the operating unit 5 is a tool for measuring voltage or electric capacity.

In other embodiments, the operating unit 5 is a voltage generator.

The yarns 2*a*, 2*b* in carbon fibre may be composed of a single carbon fibre or a bundle of carbon fibres.

The term "carbon fibre yarns" refers to fibrous materials generally produced by pyrolysis of various carbonaceous materials of synthetic origin, for example polyacrylonitrile or polisilazane, or of natural origin, such as pitch or cellulose-based materials such as vegetable fibres or wood.

The term "bundles of carbon fibres" refers to groups of carbon fibres which generally comprise from 3,000 to 50,000 fibres.

The layer 3 of nanostructured ZnO comprises ZnO in the form of "nanorods" (henceforth "ZnO NR").

The deposition method of the layer 3 of ZnO NR comprises the following steps:

a) formation of an adhesion layer on one portion of an object comprising at least two carbon fibre crossed yarns 2*a*, 2*b;* b) growth of ZnO NR on the adhesion layer of step a1); or alternatively a1) formation of an adhesion layer on a portion of two carbon fibre yarns 2*a*, 2*b;* b1) growth of ZnO NR on the adhesion layer of step a1);

c1) overlapping of the two yarns 2*a* and 2*b*.

In step c1 the two yarns can be simply rested on one another or held together using a glue or a resin.

The step a) or a1) of formation of the adhesion layer (also called "seed layer") may be achieved using two different technologies.

In some embodiments, step a) or a1) is carried out by the chemical bath technology, providing for the following steps in sequence:

A1) soaking of said object or said yarns to be coated with ZnO NR in an aqueous zinc salt solution for a predetermined time and at a predetermined temperature;

A2) soaking of said object or said yarns of step A1) in a basic aqueous solution for a predetermined time and at a predetermined temperature;

A3) drying of said object or said yarns deriving from step A2);

A4) repetition of the steps A1), A2), and A3) for a predetermined number of times.

If only a portion of the surface of the object or of the threads needs to be covered the remaining part must be appropriately screened.

In Step A1), the zinc salt is preferably zinc acetate dihydrate, more preferably a solution from 1 mM to 1 M, more preferably about 60 mM, of zinc acetate dihydrate.

In certain embodiments, step A1) is carried out at ambient temperature and for a time between 1 second and 1 hour or more, preferably between 5 seconds and 30 seconds, more preferably about 10 seconds.

In step A2), the basic aqueous solution is preferably an aqueous solution of ammonium hydroxide, more preferably an aqueous solution of ammonium hydroxide with concentrations between 0.0001% and 0.1%, preferably about 0.03% in weight.

In certain embodiments, step A2) is carried out at ambient temperature and for a time between 1 second and 1 hour or more, preferably between 5 seconds and 30 seconds, more preferably about 10 seconds.

The term "aqueous solution" is understood to mean preferably a solution in distilled water, more preferably in redistilled water.

The drying step A3) is preferably conducted at a temperature above 25° C., more preferably above 70° C., even more preferably above 90° C., in a more preferred manner at about 120° C., and preferably less than 200° C.

Steps A1), A2) and A3) are preferably repeated at least 10 times, more preferably at least 15 times, even more preferably about 20 times.

In other embodiments, step a) is carried out using the conventional technology of "sputtering" or "cathodic pulverization" which involves the use of an apparatus comprising a deposition chamber placed in a vacuum in which the object to be coated and the coating material, in this case ZnO, are placed. The coating material is hit by an ion beam, which normally has energy below 1 KeV and releases the atomised material which goes to cover the walls of the chamber and thus also the surface to be coated. If only a portion of the surface of an object is to be coated, the parts not to be coated need to be screened.

The procedure outlined above comprises the following steps in sequence:

B1) deposition of the ZnO oxide layer 3 on the portion of said object arranged in a sputtering deposition chamber under an inert atmosphere and in vacuum for a predetermined time;

B2) repetition of step B1) for a predetermined number of times.

The step B1) is carried out preferably using a power of 120 W and for a deposition time of between 30 seconds and 1 hour or more preferably between 2 to 6 minutes, even more preferably of about 4 minutes.

The passage B2) preferably provides for two to four deposition cycles, more preferably 2 deposition cycles.

The step b) or b1) of growth of ZnO NR on the adhesion layer comprises the following steps in sequence:

i) soaking of said object or said yarns 2*a*, 2*b* deriving from step a) or a1) respectively in a solution of a zinc salt and of an amine for a predetermined time and at a predetermined temperature;

ii) drying of said object or said yarns 2*a*, 2*b*.

In step i) an aqueous solution of zinc acetate dihydrate and hexamethylenetetramine is preferably used. More preferably, the concentration of the zinc salt is between 100 uM and 1 M, even more preferably about 20 mM, and the concentration of the amine is between 100 uM and 1 M, even more preferably about 20 mM.

In preferred embodiments, the treatment temperature is over 50° C., preferably over 70° C., more preferably about 90° C.

In preferred embodiments, the treatment time is between 2 and 6 hours, preferably about 4 hours.

The drying step ii) is preferably conducted at a temperature over 100° C., preferably higher than 130° C., more preferably about 150° C. and for a time of at least 5 minutes, preferably about 10 minutes.

In certain embodiments the operating unit 5 may be an instrument for measuring voltage, typically a voltmeter.

In other embodiments, the operating unit 5 comprises an instrument for measuring the electric capacity. In this case, a first yarn 2*a* is connected to a signal generator with variable frequency, while the second yarn 2*b* is placed in parallel and to ground with respect to said yarn 2*a* and connected in series to an acquisition and correction instrument of the current signal and integration of the charge. For example, the instrument TF-Analyzer 2000E equipped with a "ferroelectric module" manufactured by the company AIXACCT may be used.

The principle which said charge and electric capacity meter is based is as follows. The device of the invention may be approximated to a condenser, where the armatures are represented by the surfaces of the yarns 2*a* and 2*b* at the intersection point thereof, while the coating structure of "nanorods" constitutes the interposed dielectric material; the latter is directly responsible for the piezoelectric effect. In fact a real material is never purely dielectric and thus the piezoelectric signal, if any, is normally superimposed to other spurious contributions which in many cases are dominant, such as resistive current and leakage current. These disrupt the accuracy of the measurement and make a correct measurement of electrical capacity unreliable. By exploiting fixed amplitude and variable frequency triangular voltage impulses it is however possible to separate the dielectric contribution of the material from the resistive or leakage current.

Once the correct frequency has been selected, the measurement of electrical capacitance versus voltage is invariant only if all spurious contributions are fully subtracted. The induction of piezoelectricity, through a constant external mechanical pressure on the system, causes an increase in capacity which in turn is constant in voltage. Using for example frequency impulses of 5 KHz in the device in FIG. 1, the dielectric response is completely separate from the resistive and leakage response. For each different device the suitable frequency pulse must be found experimentally. In this regime it is therefore possible to measure the piezoelectric effect in terms of variations in the electrical capacity of the system.

In other embodiments, the operating unit 5 is a voltage generator, preferably a voltage generator with adjustable voltage. This way the device 1 acts as an actuator, changing its morphology depending on the voltage applied. Applying a static electric "poling" through the piezoelectric material (ZnO NR) the bending of the "nanorods" is induced, i.e. the formation of a net dipole moment, and as a consequence a variation of the dielectric constant of the material, in other words of its capacity, is observed. If the "poling" is suspended, the device 1 relaxes until it reaches once again the initial conformation assuming the same capacitance values found before the application of said poling. Placing an appropriate number of devices 1 in a article, for example by superimposing several layers of material in which the devices 1 are embedded, one can obtain an appreciable morphological change in the article depending on the voltage applied.

In a different embodiment, shown in FIGS. 2A and 2B, the piezoelectric device 101 according to the invention is made from a fabric 110 made of carbon fibre, consisting of weft threads 102*a* and warp threads 102*b*, on a portion of which a layer 103 of ZnO NR is arranged. It to be noted that the technologies described above for the coating of carbon fibres with ZnO NR allow the coating of even large surfaces of varying shape, thus covering a plurality of warp-weft intersections of carbon yarns which constitute as many single piezoelectric devices 1.

The device 101 is connected, either directly through the individual yarns 102*a*, 102*b* or via appropriate wiring 6*a*, 6*b*, to an operating unit 5 as described above.

In certain embodiments, the piezoelectric device 1, 101 according to the invention may be integrated in a carbon fibre article during the production process thereof.

Consequently, the production process of a article in carbon fibre comprising one or more piezoelectric devices 1, 101 comprises the following steps:

1) deposition of the ZnO NR layer 3, 103 on said carbon fibre crossed yarns 2*a*, 2*b* or on said carbon fibre fabric 110 to form a piezoelectric device 1, 101;

2) impregnation of said piezoelectric device 1, 101 of step 1) with a polymeric matrix;

3) formation of a precursor of the article or part of it;

4) polymerization of the polymeric matrix of the precursor of the article or part of it of step 3) to form a laminated carbon fibre article;

5) optionally, the formation of a multilayer article by joining one or more laminated articles of step 4) with one or more layers of carbon fibre fabric impregnated with said polymeric matrix and the successive polymerization of said polymeric matrix.

The deposition step 1) of the layer 3, 103 of ZnO NR is performed as stated above. In the case of coating a portion of fabric 110, this step may be performed either on the already woven fabric 110 or on the carbon fibre yarns 102*a*, 102*b*, before weaving.

In the impregnation step 2) with a polymeric matrix, said polymeric matrix may be selected according to the subsequent polymerization step 4) chosen.

If the polymerization is by means of treating in an autoclave, the polymeric matrix is generally a thermosetting material and is preferably selected from epoxy and phenol matrices.

If the polymerization is by means of moulding, the polymeric matrix is a thermoplastic material and is preferably selected from polyethylene (PE), polyphenylene sulphide (PPS), polyetheretherketone (PEEK) and polyethylenimide (PEI).

The polymerization step 4) may take place in an autoclave or by moulding. The autoclave process is preferred.

If the step 4) is carried out with the autoclave process, it is preferably carried out at temperatures between ambient temperature and 180° C., pressures between 1 bar and 10 bar and for a variable time depending on the size of article, more preferably between 1 and 6 hours.

If the step 4) is carried out with the moulding process, it is preferably carried out at temperatures from 100° C. up to 450° C., with pressing forces of up to 400 ton and for a time between 3 and 60 minutes.

The step 5) of joining the laminate article of step 4) with one or more layers of a carbon fibre fabric impregnated with said polymeric matrix may provide for a surface treatment of the laminate article of step 4), for example by sanding, and/or spreading the preparation of a thermosetting adhesive film on said laminated article. The thermosetting adhesive film will preferably have the same composition as the polymeric matrix used to impregnate said carbon fibre fabric.

According to a variant, the production method of a article in carbon fibre comprising one or more piezoelectric devices 1, 101 comprises the following steps:

1a) deposition of the ZnO NR layer 3, 103 on said carbon fibre crossed yarns 2_a_, 2_b_ or on said carbon fibre fabric 110 to form a piezoelectric device 1, 101;

2a) impregnation of said piezoelectric device 1, 101 of step 1a) with a polymeric matrix;

3a) impregnation of a carbon fibre fabric with said polymeric matrix;

4a) formation of a precursor of the article or part of it by joining one or more piezoelectric devices 1, 101 impregnated with said polymeric matrix according to step 2a), optionally with one or more layers of carbon fibre fabric impregnated with said polymeric matrix according to step 3a);

5a) polymerization of the precursor of the article or part of it of step 4a) to form said article.

The steps from 1a) to 5a) are performed with the same procedures as steps (1) to (5) of the previous variant of the process.

The method of the invention may be completed by one or more processing steps which provide for the finishing of the article, for example, for deburring, drilling, painting and so forth.

EXAMPLE

Following the polymerization process in an autoclave and steps 1) to 5) described above, an "I" section beam, 1 metre long, was produced to represent a hypothetical portion of an aircraft spar. The component was made with a carbon fabric having a thickness of 0.65 mm placed at 45° to the axis of the beam until it reached a thickness of about 2.6 mm. The polymerization took place in an autoclave at a temperature of 130° C. and a pressure of 6 bar for about 2 h. The article in question was then used to perform tests on the definition, by means of the invention, of the state of stress inside the component, present as a result of an applied external load.

The piezoelectric device 1, 101 of the invention can be used in various fields.

Possible areas of application of the present invention are the automotive, aerospace and aviation industry. In the aviation industry a sensor according to the invention may be used as the stress sensor integrated on primary structures such as spars, ribs and panelling. The piezoelectric device can also be used as an actuator to permit a morphological change of moving surfaces of an aircraft, in particular the geometry of the wing, so as to produce the appropriate changes in the aerodynamic forces which permit improve governability of the aircraft.

The advantages of the invention are evident from the above.

The piezoelectric device 1, 101 is simple in concept and realization and can be easily integrated, for example by embedding, in any article of any size during the production phase thereof, without requiring the subsequent positioning of the device on a preformed article as instead is necessary for the devices of the prior art.

The fact of exploiting the electrical conductivity of carbon fibres makes it possible to avoid expensive and bulky contacts, typically gold contacts, which are instead provided for by the devices previously proposed.

The device of the invention may further be used either as a sensor, such as a stress sensor, or as an actuator, for example for the morphological change of parts in carbon fibre, such as parts of the fuselage or wings of aircraft.

It is clear that the description is only one particular embodiment of the present invention, which the person skilled in the art may modify so as to adapt it to particular conditions, while remaining within the sphere of protection claimed.

The invention claimed is:

1. A piezoelectric device comprising at least two carbon fibre crossed yarns, and a zinc oxide layer in nanorod form covering a portion of each of said yards at their intersection, wherein an end of each of said yarns is connected to an operative unit.

2. The piezoelectric device according to claim 1, wherein said end of each of said yarns is directly connected to said operative unit without the interposition of a different wiring.

3. The piezoelectric device according to claim 1, wherein the operative unit is a tool for measuring voltage, current or electric capacitance.

4. The piezoelectric device according to claim 1, wherein the operative unit is a voltage generator, preferably a voltage generator with adjustable voltage.

5. The piezoelectric device according to claim 1, wherein the carbon fibre yarns can be composed of only one carbon fibre or a bundle of carbon fibres.

6. The piezoelectric device according to claim 5, wherein said bundle of carbon fibres comprises from 3,000 to 50,000 fibres.

7. The piezoelectric device according to claim 1, wherein said carbon fibres are composed of pyrolyzed carbonaceous fibrous materials of synthetic origin, for example, polyacrylonitrile or polysilazane, or of natural origin, for example, pitches or cellulose-based materials, such as vegetal fibres or wood.

8. The piezoelectric device according to claim 1, comprising a carbon fibre fabric, composed of weft yarns and warp yarns, on a portion of which a zinc oxide layer in nanorod form is arranged.

9. The piezoelectric device according to claim 3, wherein said tool for measuring charge and electric capacitance comprises a variable-frequency signal generator connected to at least one first yarn and a tool for the acquisition and correction of the current signal and the charge integration, connected to at least one second yarn.

10. An article made of a carbon fibre material, comprising at least one piezoelectric device according to claim 1.

11. The article according to claim 10, wherein said piezoelectric device is a torque sensor.

12. The article according to claim 10, wherein said piezoelectric device is an actuator device.

13. The article according to claim 10, wherein said at least one piezoelectric device is embedded or integrated in said article.

14. A method for obtaining a piezoelectric device according to claim 1, comprising the following steps:

a) formation of an adhesion layer on the portion of an object comprising at least two carbon fibre crossed yarns;

b) growth of zinc oxide in nanorod form on the adhesion layer of step a); or, alternatively, a1) formation of an adhesion layer on a portion of two carbon fibre yarns;

b1) growth of ZnO NR on the adhesion layer of step a1);

c1) overlapping of the two yarns.

15. The method according to claim 14, wherein the step a) or a1) is carried out by the chemical bath technology, providing for the following steps in sequence:

A1) soaking of said object or said yarns to be coated in an aqueous zinc salt solution for a predetermined time and at a predetermined temperature;

A2) soaking of said object or said yarns of step A1) in a basic aqueous solution for a predetermined time and at a predetermined temperature;

A3) drying of said object or said yarns deriving from step A2);

A4) repetition of the steps A1), A2), and A3) for a predetermined number of times.

16. The method according to claim 15, wherein the zinc salt is zinc acetate dihydrate, and wherein the step A2) is preferably carried out at room temperature and for a time ranging between 1 second and 1 hour or more, the basic aqueous solution being preferably an aqueous solution of ammonium hydroxide.

17. The method according to claim 15, wherein the step A2) is carried out at room temperature and for a time ranging between 1 second and 1 hour or more.

18. The method according to claim 15, wherein the steps A1), A2), and A3) are repeated at least 10 times.

19. The method according to claim 14, wherein the step a) or a1) is carried out by the conventional sputtering technology, which comprises the following steps in sequence:

B1) deposition of the zinc oxide layer on the portion of said object arranged in a sputtering deposition chamber under an inert atmosphere and in vacuum for a predetermined time;

B2) repetition of the step B1) for a predetermined number of times.

20. The method according to claim 19, wherein the step B1) is carried out by using a 120 W power and for a deposition time ranging between 30 seconds and 1 hour or more, and wherein the step B2) provides from two to four deposition cycles.

21. The method according to claim 14, wherein the step b) of growing zinc oxide in the form of nanorod on said adhesion layer comprises the following steps in sequence:

i) soaking of said object or said yarns deriving from step a) or a1) in a solution of a zinc salt and an amine for a predetermined time and at a predetermined temperature;

ii) drying of said object or said yarns.

22. The method according to claim 21, wherein the solution of said zinc salt is an aqueous solution of zinc acetate dihydrate, and the amine is hexamethylenetetramine.

23. The method according to claim 21, wherein the treatment temperature is above 50° C., and the treatment time ranges between 2 and 6 hours.

24. A method for manufacturing an article in a carbon fibre material according to claim 10, comprising one or more piezoelectric devices, said method comprising the following steps:

1) deposition of the zinc oxide layer in the form of nanorod on said carbon fibre crossed yarns or on said carbon fibre fabric to form a piezoelectric device;

2) impregnation of said piezoelectric device of step 1) with a polymeric matrix;

3) formation of a precursor of the article or part of it;

4) polymerization of the polymeric matrix of the precursor of the article or part of it of step 3) to form a laminated carbon fibre article;

5) optionally, formation of a multilayer article by joining one or more laminated articles of step 4) with one or more layers of carbon fibre fabric impregnated with said polymeric matrix and successive polymerization of said polymeric matrix.

25. The method for manufacturing a carbon fibre article according claim 10, comprising one or more piezoelectric devices, said method comprising the following steps:

1a) deposition of the zinc oxide layer in the form of nanorod on said carbon fibre crossed yarns or on said carbon fibre fabric to form a piezoelectric device;

2a) impregnation of said piezoelectric device of step 1a) with a polymeric matrix;

3a) impregnation of a carbon fibre fabric with said polymeric matrix;

4a) formation of a precursor of the article or part of it by joining one or more piezoelectric devices impregnated with said polymeric matrix according to step 2a), optionally with one or more layers of carbon fibre fabric impregnated with said polymeric matrix according to step 3a);

5a) polymerization of the precursor of the article or part of it of step 4a) to form said article.

26. The method according to claim 24, wherein the step 1) or 1a) is carried out on the already woven fabric or on the carbon fibre yarns before the weaving operation.

27. The method according to claim 24, wherein the polymerization step 4) or 4a) is carried out by an autoclave process at temperatures ranging between room temperature and 250° C. and pressures between 1 bars and 10 bars, and the polymeric matrix is a generally thermosetting material, preferably selected from epoxy and phenol matrices.

28. The method according to claim 24, wherein the step 4) or 4a) is carried out by a moulding process at temperatures from 100° C. up to 450° C., with compression forces up to 400 tons, and for a time between 3 and 60 minutes, and the polymeric matrix is a thermoplastic material, preferably selected from polyethylene (PE), polyphenylene sulfide (PPS), polyetheretherketone (PEEK), and polyethylene imide (PEI).

* * * * *